(12) United States Patent
Choi et al.

(10) Patent No.: US 9,331,009 B2
(45) Date of Patent: May 3, 2016

(54) CHIP ELECTRONIC COMPONENT AND METHOD OF MANUFACTURING THE SAME

(71) Applicant: SAMSUNG ELECTRO-MECHANICS CO., LTD., Suwon-Si, Gyeonggi-Do (KR)

(72) Inventors: Woon Chul Choi, Suwon-Si (KR); Yong Sam Lee, Suwon-Si (KR); Hwan Soo Lee, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/461,800

(22) Filed: Aug. 18, 2014

(65) Prior Publication Data

US 2015/0325510 A1 Nov. 12, 2015

(30) Foreign Application Priority Data

May 8, 2014 (KR) .................. 10-2014-0054639

(51) Int. Cl.
| | |
|---|---|
| *H01L 21/4763* | (2006.01) |
| *H01L 23/498* | (2006.01) |
| *H01L 21/48* | (2006.01) |
| *H01F 17/00* | (2006.01) |
| *H01F 27/28* | (2006.01) |

(52) U.S. Cl.
CPC ........ *H01L 23/49827* (2013.01); *H01L 21/486* (2013.01); *H01F 2017/002* (2013.01); *H01F 2027/2809* (2013.01)

(58) Field of Classification Search
CPC .................. H01F 2017/002; H01F 2027/2809
See application file for complete search history.

(56) References Cited

U.S. PATENT DOCUMENTS

| | | | | |
|---|---|---|---|---|
| 2003/0122175 A1* | 7/2003 | Buskirk | ......................... | 257/310 |
| 2004/0217440 A1* | 11/2004 | Ng et al. | ......................... | 257/528 |
| 2006/0084251 A1* | 4/2006 | Nakagawa et al. | ........... | 438/584 |
| 2012/0212919 A1* | 8/2012 | Mano et al. | .................. | 361/782 |
| 2013/0271252 A1* | 10/2013 | Fujii | ............................ | 336/200 |

FOREIGN PATENT DOCUMENTS

| | | |
|---|---|---|
| JP | 11-204337 A | 7/1999 |
| JP | 2007-067214 A | 3/2007 |

* cited by examiner

*Primary Examiner* — Angel Roman
(74) *Attorney, Agent, or Firm* — McDermott Will & Emery LLP

(57) ABSTRACT

A chip electronic component may be capable of improving connectivity between internal coils formed on upper and lower surfaces of an insulating substrate and preventing loss of inductance due to the areas of via pads by decreasing sizes of the outermost via electrodes and decreasing sizes of the via pad.

21 Claims, 3 Drawing Sheets

CHIP ELECTRONIC COMPONENT AND METHOD OF MANUFACTURING THE SAME

CROSS-REFERENCE TO RELATED APPLICATION

This application claims the benefit of Korean Patent Application No. 10-2014-0054639 filed on May 8, 2014, with the Korean Intellectual Property Office, the disclosure of which is incorporated herein by reference.

BACKGROUND

The present disclosure relates to a chip electronic component and a method of manufacturing the same.

An inductor, a chip electronic component, is a representative passive element configuring an electronic circuit together with a resistor and a capacitor to remove noise. The inductor is combined with the capacitor using an electromagnetic property to configure a resonance circuit amplifying a signal in a specific frequency band, a filter circuit, or the like.

Recently, as miniaturization and thinness of information technology (IT) devices such as various communications devices, display devices, and the like, have been accelerated, research into a technology for miniaturizing and thinning various elements such as inductors, capacitors, transistors, and the like, used in these IT devices has been continuously conducted.

The inductors have also been rapidly replaced by chips having a small size and a high density and being capable of being automatically surface-mounted, and thin film type inductors in which a mixture of magnetic powder particles and a resin is formed on coil patterns formed by plating on upper and lower surfaces of a thin film insulating substrate have been developed.

In the case of the thin film type inductor, a through-hole and a via electrode are formed in the insulating substrate to electrically connect coil patterns formed on upper and lower surfaces of the insulating substrate to each other. Here, the through-hole is mainly formed in the insulating substrate using laser. When a through hole sufficient for securing stable connection is formed in the insulating substrate, a diameter of the through-hole is increased and a size of the via electrode is therefore increased. In addition, since a via pad having a size capable of sufficiently covering the via electrode is required so as to decrease an open defect due to misalignment, a size of the via pad is also increased.

However, as the size of the via pad is increased, an area of a core part of the thin film type inductor is decreased and a magnetic material filing the core part is decreased, such that inductance (Ls) characteristics are deteriorated.

Particularly, in accordance with gradual miniaturization of products, areas occupied by the via pads in products have increased. Therefore, a method capable of decreasing the size of the via pad in order to secure the inductance (Ls) characteristics has been in demand.

RELATED ART DOCUMENT

Japanese Patent Laid-Open Publication No. 2007-067214

SUMMARY

Some embodiments in the present disclosure may provide a chip electronic component capable of improving connectivity between internal coils formed on upper and lower surfaces of an insulating substrate and preventing loss of inductance due to an area of a via pad by decreasing the size of the via pad, and a method of manufacturing the same.

According to some embodiments in the present disclosure, a chip electronic component, which includes a magnetic body including an insulating substrate, internal coil parts formed on both surfaces of the insulating substrate and electrically connected to each other by a via electrode penetrating through the insulating substrate, and an external electrode formed on an end surface of the magnetic body and connected to the internal coil part, may include: a first insulating substrate; a first via electrode penetrating through the first insulating substrate; first via pads formed on upper and lower surfaces of the first insulating substrate to cover the first via electrode; second insulating substrates stacked on the upper and lower surfaces of the first insulating substrate, respectively; second via electrodes formed on the first via pads and penetrating through the second insulating substrates; and second via pads formed on surfaces of the second insulating substrates to cover the second via electrodes, wherein the second via pad has an area smaller than that of the first via pad.

The second via electrode may have a diameter smaller than that of the first via electrode.

The second insulating substrate may have a thickness thinner than that of the first insulating substrate.

A diameter of the first via electrode may be in a range of from 40 to 80 μm.

A diameter of the second via electrode may be in a range of from 10 to 40 μm.

A thickness of the first insulating substrate may be in a range of from 50 to 70 μm.

A thickness of the second insulating substrate may be in a range of from 10 to 30 μm.

A length of a long side of the second via pad may be in a range of from 40 to 140 μm.

A distance between a center point of the first via electrode and a center point of the second via electrode in a length direction of the magnetic body may be in a range of from 50 to 80 μm.

According to some embodiments in the present disclosure, a chip electronic component may include: a magnetic body including an insulating substrate; internal coil parts formed on both surfaces of the insulating substrate and electrically connected to each other by a via electrode penetrating through the insulating substrate; and an external electrode formed on an end surface of the magnetic body and connected to the internal coil part, wherein the via electrode includes a first via electrode penetrating through a core part of the insulating substrate and second via electrodes penetrating through upper and lower portions of the insulating substrate and having a diameter smaller than that of the first via electrode.

The chip electronic component may further include first via pads formed on upper and lower surfaces of the core part of the insulating substrate to cover the first via electrode and second via pads formed on surfaces of the upper and lower portions of the insulating substrate to cover the second via pads, and the second via pad may have an area smaller than that of the first via pad.

According to some embodiments in the present disclosure, a method of manufacturing a chip electronic component by forming a via electrode penetrating through an insulating substrate, forming internal coil parts on both surfaces of the insulating substrate to be electrically connected to each other by the via electrode, and stacking magnetic layers on upper and lower portions of the insulating substrate in which the internal coil parts are formed, to form a magnetic body, may include: forming a first through-hole in a first insulating substrate and performing plating to fill the first through-hole so as to form a first via electrode and first via pads covering the first via electrode; stacking second insulating substrates on upper and lower surfaces of the first insulating substrate, respectively; and forming second through-holes in the second insulating substrates and performing plating to fill the second through-holes so as to form second via electrodes and second via pads covering the second via electrodes, wherein the second via pad has an area smaller than that of the first via pad.

The second insulating substrate may have a thickness thinner than that of the first insulating substrate.

The second through-hole may have a diameter smaller than that of the first through-hole.

The second via electrode may have a diameter smaller than that of the first via electrode.

A thickness of the first insulating substrate may be in a range of from 50 to 70 µm.

A thickness of the second insulating substrate may be in a range of from 10 to 30 µm.

A diameter of the first via electrode may be in a range of from 40 to 80 µm.

A diameter of the second via electrode may be in a range of from 10 to 40 µm.

A length of a long side of the second via pad may be in a range of from 40 to 140 µm.

A distance between a center point of the first via electrode and a center point of the second via electrode in a length direction of the magnetic body may be in a range of from 50 to 80 µm.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
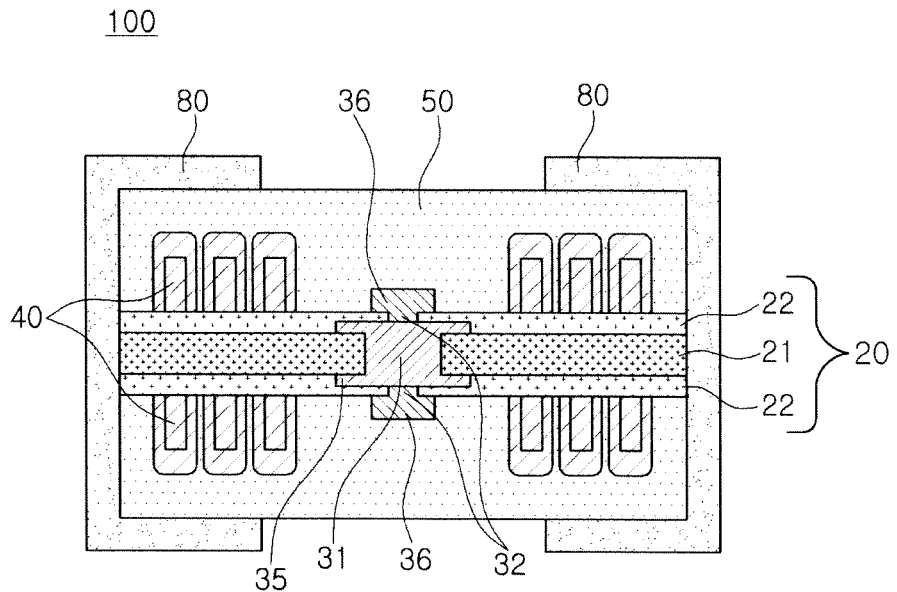
FIG. 1 is a cross-sectional view of a chip electronic component according to an exemplary embodiment of the present disclosure.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Chip Electronic Component

Hereinafter, a chip electronic component according to an exemplary embodiment in the present disclosure, in detail, a thin film type inductor will be described. However, the present disclosure is not limited thereto.

FIG. 1 is a cross-sectional view of a chip electronic component according to an exemplary embodiment of the present disclosure.

Referring to FIG. 1, as an example of a chip electronic component, a thin film type chip inductor, for example, a thin film type inductor 100 used in a power line of a power supply circuit is provided. The chip electronic component may be appropriately applied as a chip bead, a chip filter, and the like, as well as the chip inductor.

The thin film type inductor 100 may include a magnetic body 50, insulating substrates 21 and 22, internal coil parts 40, and external electrodes 80.

The magnetic body 50 may form an appearance of the thin film type inductor 100 and may be formed using any material that exhibits a magnetic property. For example, the magnetic body 50 may be formed by filling ferrite or a metal-based soft magnetic material.

The ferrite may contain known ferrite such as Mn—Zn based ferrite, Ni—Zn based ferrite, Ni—Zn—Cu based ferrite, Mn—Mg based ferrite, Ba based ferrite, Li based ferrite, or the like.

The metal based soft magnetic material may be an alloy containing one or more selected from a group consisting of Fe, Si, Cr, Al, and Ni. For example, the metal based soft magnetic material may contain Fe—Si—B—Cr based amorphous metal particles, but is not limited thereto.

The metal based soft magnetic material may have a particle diameter of 0.1 to 20 µm and may be contained in a polymer such as an epoxy resin, polyimide, or the like, in a state of being dispersed in the polymer.

An insulating substrate 20 formed in the magnetic body 50 may be, for example, a polypropylene glycol (PPG) substrate, a ferrite substrate, a metal based soft magnetic substrate, or the like.

The insulating substrate 20 may have a central hole formed in a central portion thereof so as to penetrate through the central portion thereof, and the central hole may be filled with a magnetic material such as ferrite, a metal based soft magnetic material, or the like, to form a central core part. The central core part filled with the magnetic material may be formed, thereby increasing inductance L.

The insulating substrate 20 may have the internal coil parts 40 formed on one surface and the other surface thereof, and the internal coil parts 40 have coil shaped patterns.

The internal coil parts 40 may include coil patterns formed in a spiral shape, and the internal coil parts 40 formed on one surface and the other surface of the insulating substrate 20 may be electrically connected to each other through a via electrode penetrating through the insulating substrate 20.

The insulating substrate 20 may include a first insulating substrate 21 forming a core layer of the insulating substrate and second insulating substrates 22 stacked on upper and lower surfaces of the first insulating substrate 21 and forming upper and lower portions of the insulating substrate.

The first insulating substrate 21 may have a first via electrode 31 formed therein so as to penetrate therethrough, and may have first via pads 35 formed on upper and lower surfaces thereof so as to cover the first via electrode 31.

The second insulating substrates 22 may be formed on the first insulating substrate 21 and may have second via electrodes 32 formed therein so as to penetrate therethrough and second via pads 36 formed on surfaces thereof so as to cover the second via electrodes 32.

Here, the second insulating substrate 22 may have a thickness thinner than that of the first insulating substrate 21.

When forming a through-hole for forming the via electrode, the thicker the thickness of the insulating substrate is, the larger the diameter of the through-hole is. When the diameter of the through-hole is increased, a diameter of the via electrode may be increased, and a size of the via pad covering the via electrode may also be increased. In order to decrease the diameter of the through-hole to decrease the size of the via pad, the insulating substrate needs to be formed so as to have a reduced thickness. However, there was a limitation in decreasing the thickness of the insulating substrate since the insulating substrate needs to support the internal coil parts.

Therefore, in an exemplary embodiment of the present disclosure, the first via electrode 31 and the first via pads 35 are formed in the first insulating substrate 21, the second insulating substrates 22 having a thickness thinner than that of the first insulating substrate 21 are stacked on the upper and lower surfaces of the first insulating substrate 21, and the second via electrodes 32 penetrating through the second insulating substrates 22 having a relatively thin thickness are formed, whereby sizes of the second via electrodes 32 and the second via pads 36 may be decreased.

For example, diameters of the second via electrodes 32 formed in the second insulating substrates 22 having a relatively thin thickness may be smaller than that of the first via electrode 31, and the second via pads 36 may have an area smaller than that of the first via pad 35.

The size of the second via pad 36, which is a via pad formed on the surface of the insulating substrate 20, may be decreased, such that an area of the central core part filled with the magnetic material may be increased and a relatively high level of inductance Ls may be implemented.

A thickness of the first insulating substrate 21 may be in a range of from 50 to 70 μm.

In the case in which the thickness of the first insulating substrate 21 is less than 50 μm, force supporting the internal coil parts may be relatively weak, and in the case in which the thickness of the first insulating substrate 21 exceeds 70 μm, a volume of the magnetic material filling the magnetic body may be decreased, such that inductance may be decreased and a cavity processing defect may occur.

A thickness of the second insulating substrate 22 may be 10 to 30 μm.

In the case in which the thickness of the second insulating substrate 22 is less than 10 μm, it may be difficult to process the second via electrode, and in the case in which the thickness of the second insulating substrate 22 exceeds 30 μm, a diameter of the through-hole is relatively large at the time of processing the through-hole, such that a size of the via electrode may be increased and an area of the via pad may be increased, thereby decreasing inductance.

A diameter of the first via electrode 31 may be 40 to 80 μm.

In the case in which the diameter of the first via electrode 31 is less than 40 μm, the first via electrode 31 may not sufficiently penetrate through the first insulating substrate 21, such that electrical connectivity may be deteriorated, and in the case in which the diameter of the first via electrode 31 exceeds 80 μm, an inductance Ls may be decreased.

A diameter of the second via electrode 32 may be 10 to 40 μm.

In the case in which the diameter of the second via electrode 32 is less than 10 μm, the second via electrode 32 may not sufficiently penetrate through the second via insulating substrate 22, such that electrical connectivity may be deteriorated, and in the case in which the diameter of the second via electrode 32 exceeds 40 μm, an area of the second via pad 36 may be increased in order to decrease the occurrence of an open defect due to misalignment, such that an area of the central core part may be decreased and inductance may be decreased.

The first via pad 35 and the second via pad 36 may have any shape that may prevent the open defect due to misalignment and may have, for example, a circular shape, an oval shape, a rectangular shape, or the like.

Along side of the second via pad 36, a length thereof, may be in a range of from 40 to 140 μm.

In the case in which the length of the second via pad 36 is less than 40 μm, an open defect, or the like, due to misalignment may occur, and in the case in which the length of the second via pad 36 exceeds 140 μm, an area of the central core part may be decreased and inductance may be decreased.

Figure 2:
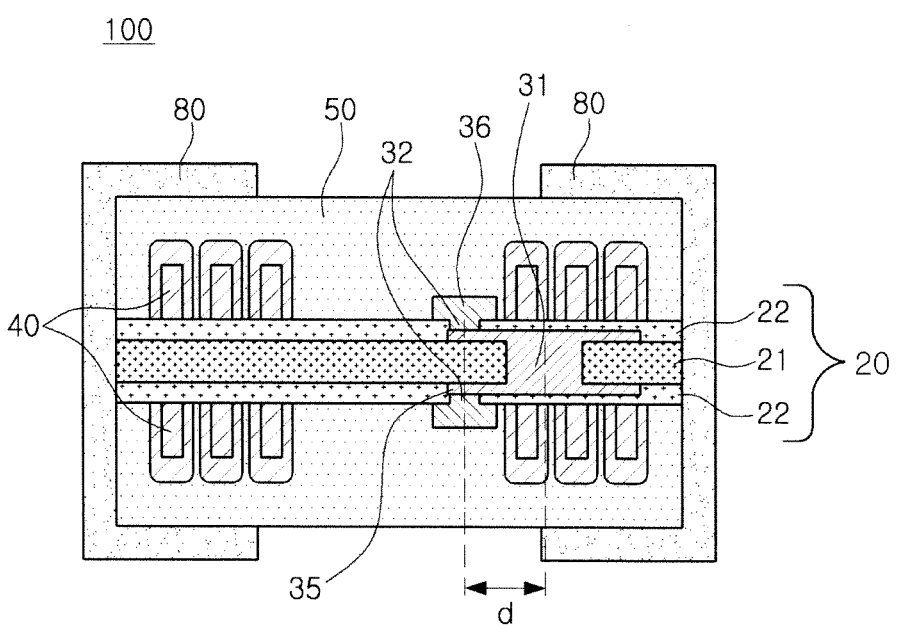
FIG. 2 is a cross-sectional view of a chip electronic component according to another exemplary embodiment of the present disclosure.

FIG. 2 is a cross-sectional view of a chip electronic component according to another exemplary embodiment of the present disclosure.

Referring to FIG. 2, the second via electrodes 32 may be formed in a position deviating from that of the first via electrode 31 so as to be spaced apart from the first via electrode 31 by a predetermined distance.

A distance d between a center point of the first via electrode 31 and a center point of the second via electrode 32 in a length direction of the magnetic body 50 may be 50 to 80 μm. The first and second via electrodes 31 and 32 are formed so that the distance between the centers of the first and second via electrodes 31 and 32 in the length direction of the magnetic body 50 is 50 to 80 μm, whereby a dimple defect and an open defect at the time of performing fill-plating of the via electrodes may be prevented.

The internal coil parts 40 and the first and second via electrodes 31 and 32 may be formed using a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

An insulating film coating the internal coil part 40 may be formed on a surface of the internal coil part 40.

The insulating film may be formed by a commonly known method such as a screen printing method, an exposure and development method of a photoresist (PR), a spray applying method, or the like, but is not limited thereto.

One end portion of the internal coil part 40 formed on one surface of the insulating substrate 20 may be exposed to one end surface of the magnetic body 50 in a length direction of the magnetic body 50, and one end portion of the internal coil part 40 formed on the other surface of the insulating substrate 20 may be exposed to the other end surface of the magnetic body 50 in the length direction of the magnetic body 50.

The external electrodes 80 may be formed on both end surfaces of the magnetic body 50 so as to be connected to lead-out portions of the internal coil parts 40 exposed to both end surfaces of the magnetic body 50, respectively.

The external electrodes 80 may be formed on both end surfaces of the magnetic body 50 in the length direction thereof, and may be extended to upper and lower surfaces of the magnetic body 50 in a thickness direction thereof, and/or both side surfaces of the magnetic body 50 in a width direction thereof.

The external electrodes 80 may be formed using a metal having excellent electrical conductivity, for example, nickel (Ni), copper (Cu), tin (Sn), or silver (Ag), or an alloy thereof, etc.

Method of Manufacturing Chip Electronic Component

FIGS. 3 through 8 are views sequentially illustrating a method of manufacturing a chip electronic component according to an exemplary embodiment of the present disclosure.

Figure 3:
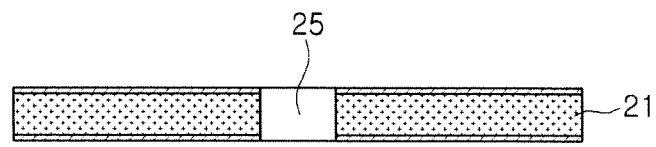
FIGS. 3 through 8 are views sequentially illustrating a method of manufacturing a chip electronic component according to an exemplary embodiment of the present disclosure.

Referring to FIG. 3, a first through-hole 25 may be formed in the first insulating substrate 21.

The first insulating substrate 21 may have metal layers, for example, copper (Cu) layers, formed on both surfaces thereof.

The first insulating substrate 21 may be, for example, a polypropylene glycol (PPG) substrate, a ferrite substrate, a metal based soft magnetic substrate, or the like, and may have a thickness of 50 to 70 μm.

The first through-hole 25 may be formed using mechanical drilling or laser drilling, but is not limited thereto. Here, the laser drilling may be $CO_2$ laser drilling or yttrium aluminum garnet (YAG) laser drilling, but is not limited thereto.

Figure 4:
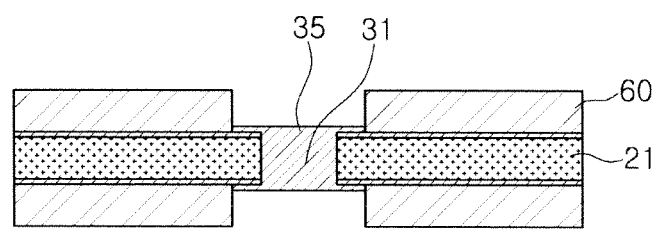

Referring to FIG. 4, photoresists 60 may be formed on the first insulating substrate 21 having the metal layers formed thereon, to then be subjected to a plating process so as to form the first via electrode 31 and the first via pads 35.

As the photoresist 60, a general photosensitive resist film, a dry film resist or the like may be used, but is not limited thereto.

The first via electrode 31 and the first via pads 35 may be formed using a metal having excellent electrical conductivity, for example, silver (Ag), palladium (Pd) aluminum (Al), nickel (Ni), titanium (Ti), gold (Au), copper (Cu), platinum (Pt), or an alloy thereof, etc.

A diameter of the first via electrode 31 may be 40 to 80 μm.

Figure 5:
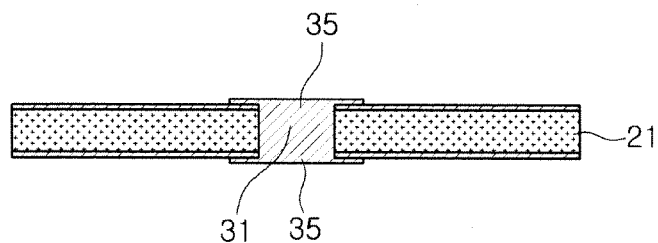

Referring to FIG. 5, the photoresists 60 may be stripped, and an etching process may be performed to remove the metal layers formed on both surfaces of the first insulating substrate 21.

Figure 6:
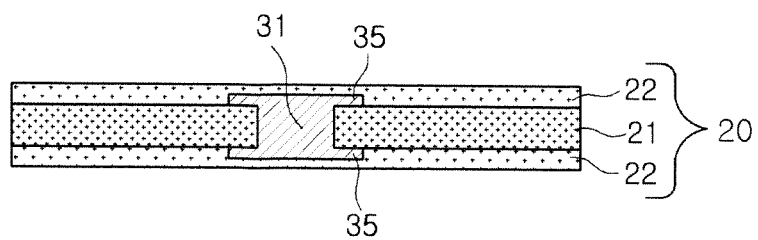

Referring to FIG. 6, the second insulating substrates 22 may be stacked on the upper and lower surfaces of the first insulating substrate 21, respectively.

The second insulating substrate 22 may have a thickness thinner than that of the first insulating substrate 21.

When the through-hole for the formation of the via electrode is formed, the thicker the thickness of the insulating substrate is, the larger the diameter of the through-hole is. When the diameter of the through-hole is increased, a diameter of the via electrode may be increased, and a size of the via pad covering the via electrode may also be increased. In order to decrease the diameter of the through-hole to decrease the size of the via pad, the insulating substrate needs to be formed to have a reduced thickness. However, there have been limitations in decreasing the thickness of the insulating substrate in order to decrease the size of the via electrode and the via pad since the insulating substrate needs to support the internal coil part.

Therefore, in an exemplary embodiment of the present disclosure, the first via electrode 31 and the first via pads 35 are formed in the first insulating substrate 21, the second insulating substrates 22 having a thickness thinner than that of the first insulating substrate 21 are stacked on the upper and lower surfaces of the first insulating substrate 21, and the second via electrodes 32 penetrating through the second insulating substrates 22 having a relatively thin thickness are formed, whereby sizes of the second via electrodes 32 and the second via pads 36 may be decreased.

The second insulating substrate 22 may be, for example, a polypropylene glycol (PPG) substrate, a ferrite substrate, a metal based soft magnetic substrate, or the like, and may have a thickness of 10 to 30 μm.

Figure 7:
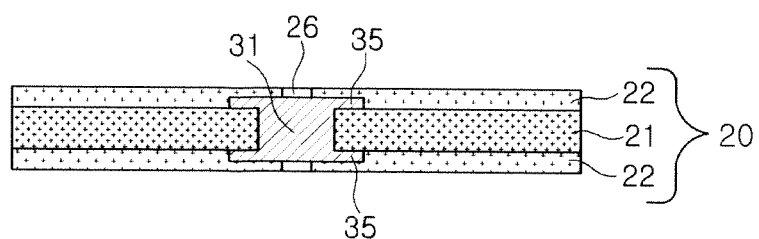

Referring to FIG. 7, second through-holes 26 may be formed in the second insulating substrates 22.

The second through-hole 26 may be formed using mechanical drilling or laser drilling, but is not limited thereto.

Here, the laser drilling may be $CO_2$ laser drilling or YAG laser drilling, but is not limited thereto.

Here, since the second insulating substrate 22 has a thickness thinner than that of the first insulating substrate 21, a diameter of the second through-hole 26 may be smaller than that of the first through-hole 25.

Figure 8:
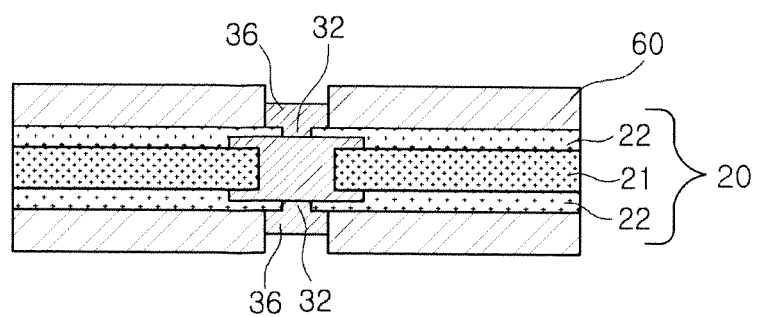

Referring to FIG. 8, photoresists 60 may be formed on the second insulating substrates 22, to then be subjected to a plating process so as to form the second via electrodes 32 and the second via pads 36.

Diameters of the second via electrodes 32 formed in the second insulating substrates 22 having a relatively thin thickness may be smaller than that of the first via electrode 31, and the second via pads 36 may have an area smaller than that of the first via pad 35.

As the size of the second via pad 36 formed on the surface of the insulating substrate 20 is decreased, an area of the central core part filled with the magnetic material may be increased and a high level of inductance Ls may be implemented.

The second via electrodes 32 and the first via pads 36 may be formed using a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

A diameter of the second via electrode 32 may be 10 to 40 nm, and a long side of the second via pad 36, a length thereof, may be 40 to 140 μm.

Meanwhile, the second via electrodes 32 may be formed in a position deviating from that of the first via electrode 31 so as to be spaced apart from the first via electrode 31 by a predetermined distance.

A distance d between a center point of the first via electrode 31 and a center point of the second via electrode 32 in a length direction of the magnetic body 50 may be 50 to 80 μm. The first and second via electrodes 31 and 32 are formed so that the distance between the centers of the first and second via electrodes 31 and 32 in the length direction of the magnetic body 50 is 50 to 80 μm, whereby a dimple defect and an open defect at the time of performing fill-plating of the via electrodes may be prevented.

Next, after the photoresists 60 are stripped, the internal coil parts 40 electrically connected to each other by the first and second via electrodes 31 and 32 may be formed on both surfaces of the insulating substrate 20.

A method of forming the internal coil part 40 may be, for example, an electroplating method, but is not limited thereto. The internal coil part 40 may be formed using a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

After the internal coil parts 40 are formed, an insulating layer coating the internal coil parts 40 may be formed. The insulating layer may be formed by a commonly known method such as a screen printing method, an exposure and development method of a photoresist (PR), a spray applying method, or the like, but is not limited thereto.

Next, the magnetic layers may be stacked on upper and lower portions of the insulating substrate 20 having the internal coil part 40 formed therein, to form the magnetic body 50.

The magnetic layers may be stacked on both surfaces of the insulating substrate 20 and may be compressed by a laminating method or an isostatic pressing method to form the magnetic body 50. Here, the central core part may be formed by filling the central hole formed in the central portion of the insulating substrate 20 with the magnetic material.

Next, the external electrode 80 may be formed to be connected to the internal coil part 40 exposed to at least one end surface of the magnetic body 50.

The external electrode 80 may be formed using a paste containing a metal having excellent electrical conductivity, for example, a conductive paste containing nickel (Ni), copper (Cu), tin (Sn), or silver (Ag), or an alloy thereof, etc. The external electrode 80 may be formed by a dipping method, or the like, as well as a printing method, depending on a shape thereof.

A description of features the same as those of the chip electronic component according to the foregoing exemplary embodiment of the present disclosure described above will be omitted.

According to exemplary embodiments of the present disclosure, connectivity between internal coils formed on upper and lower surfaces of the insulating substrate may be improved, and sizes of outermost via electrodes may be decreased to decrease sizes of via pads. Therefore, loss of inductance due to areas of the via pads may be prevented, such that a high level of capacitance and subminiature products may be implemented.

While exemplary embodiments have been shown and described above, it will be apparent to those skilled in the art that modifications and variations could be made without departing from the spirit and scope of the present disclosure as defined by the appended claims.

What is claimed is:

1. A chip electronic component including a magnetic body including an insulating substrate, internal coil parts formed on both surfaces of the insulating substrate and electrically connected to each other by a via electrode penetrating through the insulating substrate, and an external electrode formed on an end surface of the magnetic body and connected to the internal coil part,
    wherein the insulating substrate comprises a first insulating substrate; and
    second insulating substrates stacked on the upper and lower surfaces of the first insulating substrate, respectively,
    wherein the via electrode comprises a first via electrode penetrating through the first insulating substrate;
    first via pads disposed on upper and lower surfaces of the first insulating substrate to cover the first via electrode;
    second via electrodes disposed on the first via pads and penetrating through the second insulating substrates; and
    second via pads disposed on surfaces of the second insulating substrates to cover the second via electrodes, and
    wherein the second via pad has an area smaller than that of the first via pad.

2. The chip electronic component of claim 1, wherein the second via electrode has a diameter smaller than that of the first via electrode.

3. The chip electronic component of claim 1, wherein the second insulating substrate has a thickness thinner than that of the first insulating substrate.

4. The chip electronic component of claim 1, wherein a diameter of the first via electrode is in a range of from 40 to 80 μm.

5. The chip electronic component of claim 1, wherein a diameter of the second via electrode is in a range of from 10 to 40 μm.

6. The chip electronic component of claim 1, wherein a thickness of the first insulating substrate is in a range of from 50 to 70 μm.

7. The chip electronic component of claim 1, wherein a thickness of the second insulating substrate is in a range of from 10 to 30 μm.

8. The chip electronic component of claim 1, wherein a length of a long side of the second via pad is in a range of 25 from 40 to 140 μm.

9. The chip electronic component of claim 1, wherein a distance between a center point of the first via electrode and a center point of the second via electrode in a length direction of the magnetic body is in a range of from 50 to 80 μm.

10. A chip electronic component comprising:
    a magnetic body including an insulating substrate;
    internal coil parts formed on both surfaces of the insulating substrate and electrically connected to each other by a via electrode penetrating through the insulating substrate; and
    an external electrode formed on an end surface of the magnetic body and connected to the internal coil part,
    wherein the via electrode includes a first via electrode penetrating through a core part of the insulating substrate, and second via electrodes penetrating through upper and lower portions of the insulating substrate and having a diameter smaller than that of the first via electrode.

11. The chip electronic component of claim 10, further comprising first via pads formed on upper and lower surfaces of the core part of the insulating substrate to cover the first via electrode and second via pads formed on surfaces of the upper and lower portions of the insulating substrate to cover the second via pads,
    wherein the second via pad has an area smaller than that of the first via pad.

12. A method of manufacturing a chip electronic component by forming a via electrode penetrating through an insulating substrate, forming internal coil parts on both surfaces of the insulating substrate to be electrically connected to each other by the via electrode and stacking magnetic layers on upper and lower portions of the insulating substrate in which the internal coil parts are formed, to form a magnetic body, the forming of a via electrode penetrating through an insulating substrate comprising:
    forming a first through-hole in a first insulating substrate and performing plating to fill the first through-hole so as to form a first via electrode and first via pads covering the first via electrode;
    stacking second insulating substrates on upper and lower surfaces of the first insulating substrate, respectively; and
    forming second through-holes in the second insulating substrates and performing plating to fill the second through-holes so as to form second via electrodes and second via pads covering the second via electrodes,
    wherein the insulating substrate comprises the first insulating substrate and second insulating substrates,
    the via electrode comprises the first via electrode, first via pads, second via electrodes, and second via pads, and
    the second via pad has an area smaller than that of the first via pad.

13. The method of claim 12, wherein the second insulating substrate has a thickness thinner than that of the first insulating substrate.

14. The method of claim 12, wherein the second through-hole has a diameter smaller than that of the first through-hole.

15. The method of claim 12, wherein the second via electrode has a diameter smaller than that of the first via electrode.

16. The method of claim 12, wherein a thickness of the first insulating substrate is in a range of from 50 to 70 μm.

17. The method of claim 12, wherein a thickness of the second insulating substrate is in a range of from 10 to 30 μm.

18. The method of claim 12, wherein a diameter of the first via electrode is in a range of from 40 to 80μm.

19. The method of claim 12, wherein a diameter of the second via electrode is in a range of from 10 to 40 μm.

20. The method of claim 12, wherein a length of a long side of the second via pad is in a range of from 40 to 140 μm.

21. The method of claim 12, wherein a distance between a center point of the first via electrode and a center point of the second via electrode in a length direction of the magnetic body is in a range of from 50 to 80 μm.

\* \* \* \* \*